United States Patent
Hao et al.

(10) Patent No.: US 9,927,490 B2
(45) Date of Patent: Mar. 27, 2018

(54) INTEGRATED CIRCUIT WITH SECURE SCAN ENABLE

(71) Applicant: FREESCALE SEMICONDUCTOR, INC., Austin, TX (US)

(72) Inventors: Pingli Hao, Suzhou (CN); Wanggen Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 29 days.

(21) Appl. No.: 15/201,503

(22) Filed: Jul. 3, 2016

(65) Prior Publication Data
US 2017/0089978 A1 Mar. 30, 2017

(30) Foreign Application Priority Data
Sep. 28, 2015 (CN) .......................... 2015 1 1010626

(51) Int. Cl.
*G01R 11/00* (2006.01)
*G01R 31/3177* (2006.01)
*G01R 31/3185* (2006.01)

(52) U.S. Cl.
CPC . *G01R 31/3177* (2013.01); *G01R 31/318536* (2013.01)

(58) Field of Classification Search
CPC ................. G01R 31/3177; G01R 31/318536
See application file for complete search history.

(56) References Cited

U.S. PATENT DOCUMENTS

| | | | |
|---|---|---|---|
| 7,185,249 B2 | 2/2007 | Tkacik et al. | |
| 7,334,173 B2 | 2/2008 | Morgan et al. | |
| 7,725,788 B2 | 5/2010 | Tkacik et al. | |
| 7,815,249 B2 | 10/2010 | Seksaria et al. | |
| 7,975,307 B2 | 7/2011 | Tkacik et al. | |
| 7,987,331 B2 | 7/2011 | Borri | |
| 2010/0023719 A1* | 1/2010 | Borri .............. | G01R 31/318544 711/163 |
| 2010/0333055 A1* | 12/2010 | Yu ..................... | G01R 31/31719 716/108 |
| 2012/0246528 A1* | 9/2012 | Pugliesi-Conti ............ | G01R 31/318588 714/726 |
| 2014/0344919 A1* | 11/2014 | Wu .......................... | G06F 21/74 726/17 |
| 2015/0033360 A1* | 1/2015 | Doshi ..................... | G06F 21/44 726/27 |

* cited by examiner

*Primary Examiner* — Thien Nguyen
(74) *Attorney, Agent, or Firm* — Charles E. Bergere

(57) ABSTRACT

An integrated circuit senses attempts to access security-related data stored in registers connectable into a scan chain when the attempt includes locally and selectively asserting a scan-enable signal at a corresponding branch of the scan-enable tree when the integrated circuit is in a secure functional mode. When such an attempt is detected, the integrated circuit (i) generates a security warning that causes a reset of the security-related data and/or (ii) engages a bypass switch to disconnect the scan chain from the respective output terminal to preclude the security-related data from being shifted out of the IC via the scan chain.

16 Claims, 5 Drawing Sheets

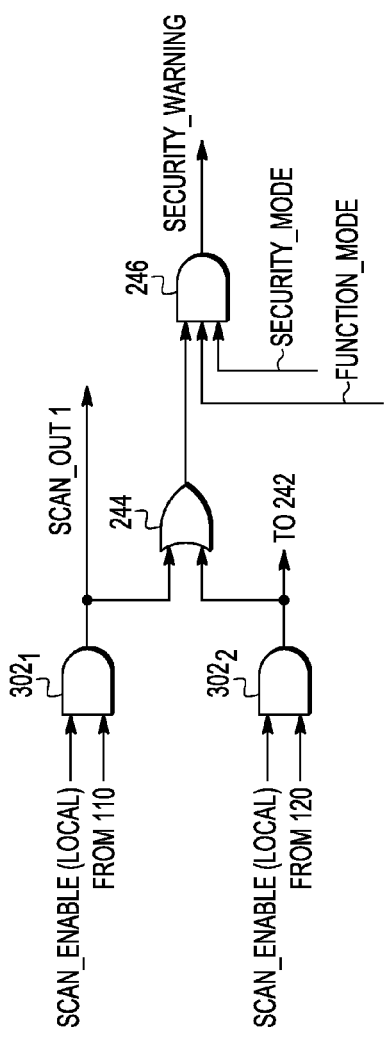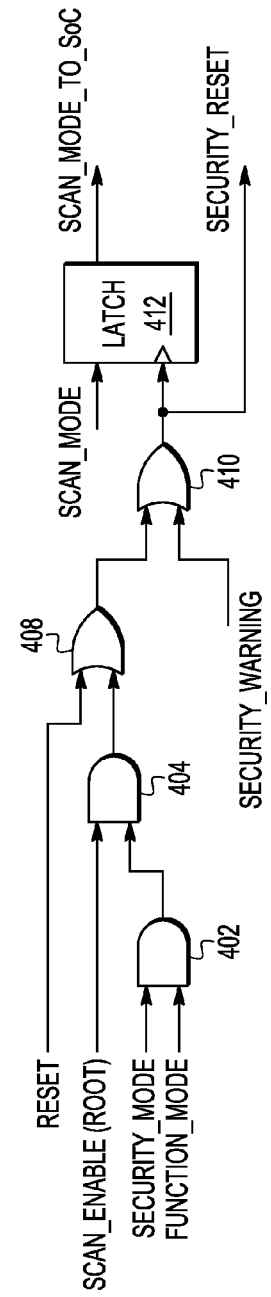
FIG. 3
FIG. 4

INTEGRATED CIRCUIT WITH SECURE SCAN ENABLE

BACKGROUND

The present invention relates to integrated circuit (IC) testing, and more particularly, to scan testing of integrated circuits and/or devices.

Integrated circuit may be tested at multiple stages of the hardware manufacturing process and, for some products, for hardware maintenance and/or troubleshooting in a customer's environment. A conventional method of testing ICs, referred to as scan testing, relies on registers (e.g., flip-flops or latches) connected, in a switchable manner, in one or more scan chains that provide access to internal nodes of the IC. Test patterns can be shifted in via the scan chain(s), clock signals can then be pulsed to test the selected IC function, and the results can consequently be shifted out and compared with the expected results to detect whether any test fails.

One problem with conventional scan testing is that it may be possible, in some circuits, to shift sensitive data, such security codes, out of the circuit. Security codes stored in semiconductor chips are widely used, for example, in the telecommunications industry for hardware identification and authentication, to enter a secure state or mode, for data encryption, etc. If the circuitry responsible for handling a security code is accessible via a scan chain, then the data could become susceptible to unauthorized access by switching the IC from functional mode to a scan or debug mode, and/or by manipulating the scan-enable signal to shift out the secure information.

A conventional approach to protect secure information in an IC from scan-based attacks is maintain registers that receive such secure information outside of the scan chains, thereby making them inaccessible from the IC's scan ports. However, a drawback of this approach is a concomitant reduction in the scan-test coverage of the IC. Accordingly, it would be advantageous to be able to maintain secure data without reducing the testability of the IC.

BRIEF DESCRIPTION OF THE DRAWINGS

Embodiments of the present invention(s) are illustrated herein by way of example and are not limited by the accompanying figures, in which like references indicate similar elements. Elements in the figures are illustrated for simplicity and clarity and have not necessarily been drawn to scale. Various aspects, features, and benefits of the disclosed embodiments will become more fully apparent, by way of example, from the following detailed description that refers to the accompanying figures, in which:

FIG. 3 is a schematic block diagram of a logic circuit of the circuitry of FIG. 2 according to an alternative embodiment of the invention;

FIG. 4 is a schematic block diagram of a logic circuit that can be used in the IC of FIG. 1 according to an embodiment of the invention.

DETAILED DESCRIPTION

Figure 1:
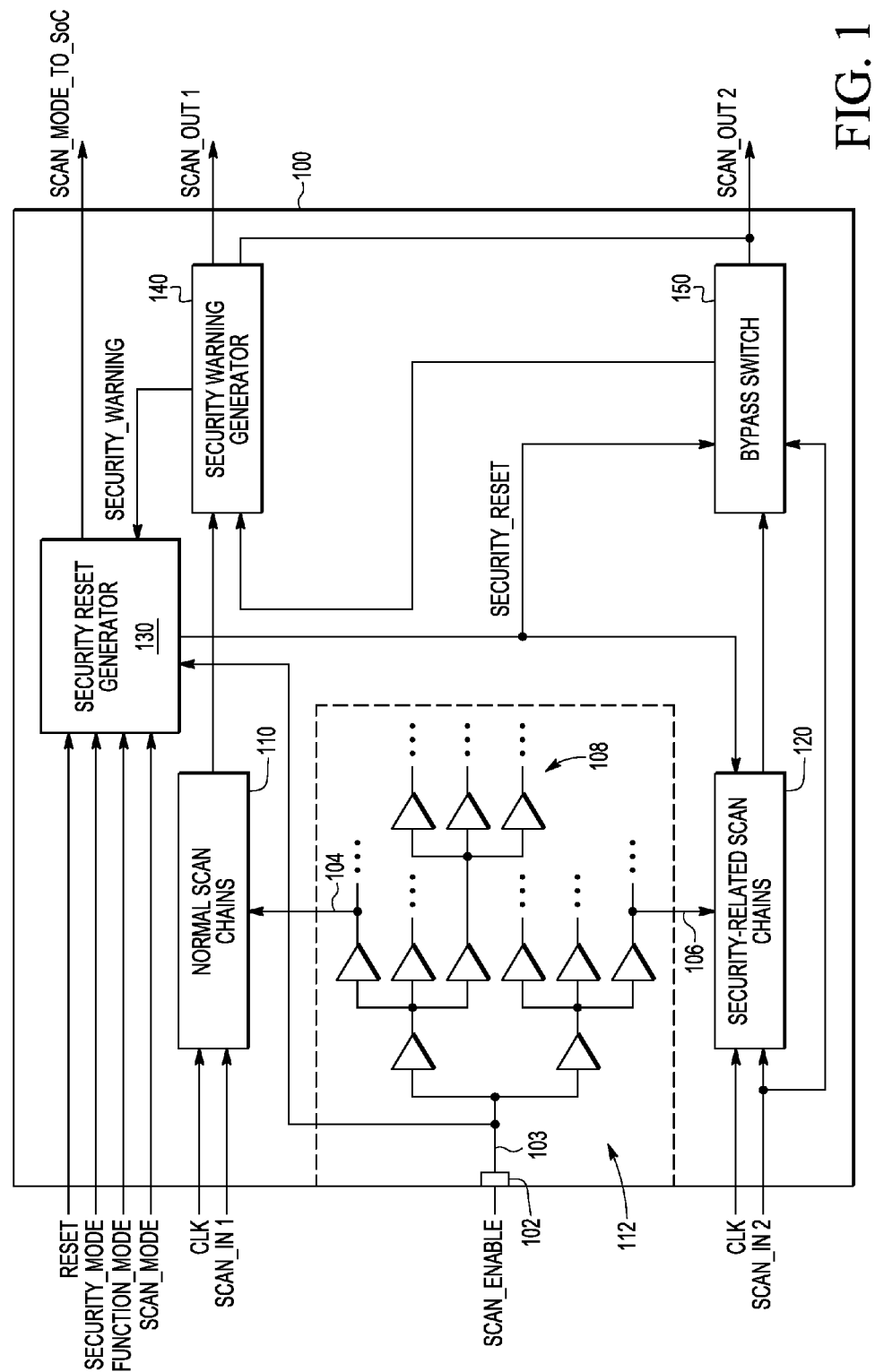
FIG. 1 is a schematic block diagram of an integrated circuit (IC) according to an embodiment of the invention.

Detailed illustrative embodiments of the present invention are disclosed herein. However, specific structural and functional details to which the disclosure refers are merely representative for purposes of describing example embodiments of the present invention. Embodiments of the present invention may be embodied in many alternative forms and should not be construed as limited to only the embodiments set forth herein.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative embodiments, certain functions or acts may occur out of the order indicated in the figures.

As used herein, the terms "assert" and "de-assert" are used when referring to the rendering of a control signal, status bit, or other relevant functional feature or element into its logically true and logically false state, respectively. If the logically true state is a logic level one, then the logically false state is a logic level zero. Alternatively, if the logically true state is logic level zero, then the logically false state is logic level one.

In various alternative embodiments, each logic signal described herein may be generated using positive or negative logic circuitry. For example, in the case of a negative logic signal, the signal is active low, and the logically true state corresponds to a logic level zero. Alternatively, in the case of a positive logic signal, the signal is active high, and the logically true state corresponds to a logic level one.

In accordance with the present invention, at least some of the above-discussed problems in conventional ICs are addressed by configuring the IC to sense an attempt to access security-related data stored in registers connectable into a scan chain when the attempt includes locally and selectively asserting a scan-enable signal at a corresponding branch of the scan-enable tree with the IC remaining in a secure function mode. When such an attempt is detected, the IC automatically responds by (i) generating a security warning that causes a reset of the security-related data and/or (ii) engaging a bypass switch to disconnect the scan chain from the respective output terminal, thereby precluding the sensitive data from being shifted out of the scan chain.

In one embodiment, the present invention is an integrated circuit (IC) including a plurality of registers that are connectable in two or more scan chains for scan-testing the IC in response to a scan-enable signal being asserted. A security-warning generator is operatively connected to the scan chains and asserts a security-warning signal in response to the scan-enable signal being asserted at a first subset of the scan chains when the scan-enable signal is not asserted at a second subset of the scan chains. The IC is automatically configurable to prevent data from being read from at least some of the registers in response to the security-warning signal being asserted by the security-warning generator.

In another embodiment, the present invention is a method of protecting an IC from a security breach. The method includes configuring a plurality of registers connectable in two or more scan chains for scan-testing the IC in response to a scan-enable signal being asserted; configuring a security-warning generator operatively connected to the scan chains to assert a security-warning signal in response to the scan-enable signal being asserted at a first subset of the scan chains when the scan-enable signal is not asserted at a second subset of the scan chains; and configuring the IC to prevent data from being read from at least some of the registers in response to the security-warning signal being asserted by the security-warning generator.

In yet another embodiment, the present invention is a method of protecting an IC from a security breach when a plurality of registers in the IC are connected in two or more scan chains for scan-testing the IC. The method includes detecting a condition when a scan-enable signal is asserted at a first subset of the scan chains while the scan-enable signal is not asserted at a second subset of the scan chains; and automatically configuring the IC to prevent data from being read from at least some of the registers in response to the detected condition.

In some embodiments, the security-warning generator is configured to assert the security-warning signal in response to the scan-enable signal being asserted at a root of the scan-enable tree and/or at every one of the scan chains.

FIGS. 1-7 illustrate example embodiments of an IC and a method of scan-testing an IC that can be used to inhibit or avert security breaches, e.g., by preventing unauthorized access to secure or proprietary data via the IC's scan chain(s). The protection afforded to the secure data enables the IC to achieve relatively high testability, e.g., by avoiding the conventionally practiced technique of making registers configured to receive secure information not connectable to scan chains, thereby enabling a desirably high scan-test coverage of the IC.

Referring now to FIG. 1, a schematic block diagram of an IC 100 according to an embodiment of the invention is shown. The IC 100 includes scan-test circuitry and, as such, has a plurality of scan chains, only two of which, labeled 110 and 120, are shown in FIG. 1 for illustration purposes. As known in the art, a scan chain may be formed by placing a multiplexer or mux (not shown in FIG. 1; see, e.g., FIG. 2) at the input of each flip-flop in a selected subset of flip-flops (also not shown in FIG. 1) in such a way that the flip-flops can be connected (i) to one another to form a serial shift register and (ii) as functional elements of IC function. An example structure of a scan chain is shown in more detail in FIG. 2. A person of ordinary skill in the art will understand that other scan-chain structures can similarly be used in alternative embodiments of the invention.

The IC 100 can be reconfigured from a functional mode to a scan mode by de-asserting a FUNCTION_MODE signal and asserting the SCAN_MODE and SCAN_ENABLE signals. The IC 100 includes a set of connections that form a scan-enable tree 112. A root of the scan-enable tree 112 includes a peripheral pin or pad 102 to which an externally generated signal can be applied to assert or de-assert the Scan-enable signal at the root. The scan-enable tree 112 further includes a plurality of branches, with only some of the branches being shown in FIG. 1. For example, a branch 104 is connected to the scan-enable tree 112 and configured to apply the SCAN-ENABLE signal to the scan chain 110. Another branch, labeled 106, is similarly connected to the scan-enable tree 112 and configured to apply the SCAN_ENABLE signal to the scan chain 120. Also shown in FIG. 1 is an additional set 108 of branches of the scan-enable tree 112. In one embodiment, some or all of the branches in the set 108 are configured to apply the SCAN_ENABLE signal to additional scan chains (not explicitly shown in FIG. 1) of the IC 100. A trunk 103 of the scan-enable tree 112 is connected to apply the SCAN_EN-ABLE signal from the pad 102 to a security-reset generator 130.

In One embodiment, the IC 100 has two types of scan chains, with the scan chains 110 and 120 being examples of the first type and the second type, respectively. More specifically, the scan chain 110 is a "normal" scan chain in the sense that, in operation, the flip-flops therein do not receive or store security-related data, such as security codes or keys and the like. In contrast, the scan chain 120 is a "security-related" scan chain because, in operation, some or all of the flip-flops therein can receive or store security-related data.

When the SCAN_MODE and SCAN_ENABLE signals are asserted, the scan chains 110 and 120 may receive data through the scan ports SCAN_IN1 and SCAN_IN2, respectively, and output data through the scan ports SCAN_OUT1 and SCAN_OUT2, respectively. Using this accessibility of flip-flops in the scan chains 110 and 120, a scan-based test of the IC 100 may be conducted, for example, using the following processing steps: (i) asserting the SCAN_MODE and SCAN_ENABLE signals; (ii) shifting into the scan chains 110 and 120, through the scan ports SCAN_IN1 and SCAN_IN2, respectively, desired test vectors; (iii) de-asserting the SCAN_ENABLE signal; (iv) applying one or more pulses of a clock signal CLK to process the test vectors using logic circuitry connected to the scan chains' flip-flops to produce test results that are stored back into those flip-flops; (v) re-asserting the SCAN_ENABLE signal; and (vi) shifting out of the scan chains 110 and 120, through the scan ports SCAN_OUT1 and SCAN_OUT2, respectively, the test results captured in the flip-flops of the scan chains.

The security-reset generator 130 operates to automatically protect security-related data in the scan chain 120 (and other security-related scan chains, not explicitly shown in FIG. 1) from being accessible through scan ports of the IC 100, such as the scan port SCAN_OUT2. For example, in one embodiment, the IC 100 can be placed into a scan mode by (i) de-asserting a FUNCTION_MODE signal and (ii) asserting the SCAN_MODE signal. The security-reset generator 130 responds to these control-signal changes by automatically asserting a SECURITY_RESET signal. When the SECURITY_RESET signal is asserted, the scan chain 120 automatically resets (e.g., to zero) all information bits stored in its flip-flops before these information bits can be shifted out of the scan chain 120 to the scan port SCAN_OUT2.

An additional example of how the SECURITY_RESET signal may be asserted in response to control-signal changes effected from peripheral pins or pads of the IC 100 is described in more detail below in reference to FIG. 6.

While the above-described flip-flop resets protect the secure data from unauthorized access when the operating mode of the IC 100 is manipulated directly from the IC's peripheral pins or pads, additional protection may be required to detect and thwart more-sophisticated unauthorized access attempts, such as those relying on electrical probes instead of the IC's peripheral pins or pads. For example, electrical probes can be used to locally assert a scan-enable signal at a selected branch, e.g., the branch 106, of the scan-enable tree 112 with the IC remaining in a secure functional mode and without the SCAN_ENABLE signal being asserted at the pad 102 and/or the trunk 103. Without receiving the asserted SCAN_ENABLE signal via the trunk 103, the security-reset generator 130 might not be able to detect a configuration change that makes the flip-flops of the selected branch accessible via the corresponding scan port and might not assert the SECURITY_RESET signal, thereby allowing for the secure data to be shifted out without being reset.

The above-indicated security threat is addressed in the IC 100 according to an embodiment of the invention by incorporating into the IC 100 a security-warning generator 140 and/or a bypass switch 150. In one embodiment, the security-warning generator 140 senses an attempt to access secure data stored in flip-flops connectable into a scan chain, such as the scan chain 120, when the attempt includes locally and selectively asserting a scan-enable signal at a corresponding branch of the scan-enable tree 112, such as the branch 106, when the IC 100 is still in a secure functional mode. When such an attempt is detected, the security-warning generator 140 automatically (i) asserts a SECURITY_WARNING signal and (ii) applies the asserted SECURITY_WARNING signal to the security-reset generator 130, e.g., as indicated in FIG. 1. In response to receiving the SECURITY_WARNING signal, the security-reset generator 130 asserts the SECURITY_RESET signal, thereby precluding the security-related data from being shifted out of the scan chain(s) as further detailed below.

The scan chains 110 and 120 are operatively connected to the security-warning generator 140, as indicated in FIG. 1. The security-warning generator 140 is configured to automatically generate the SECURITY_WARNING signal so that it is asserted when an unexpected (e.g., not conforming to the specified operating procedures) scan-enable assertion occurs at any branch of the scan-enable tree 112, when the SCAN_ENABLE signal is not asserted at the root and/or at at least one of the other branches of the scan-enable tree 112. The security-warning generator 140 may also include registers (not explicitly shown in FIG. 1, see FIG. 2) configured as tail registers of the scan chains 110 and 120. In operation, any data being shifted out of the scan chains 110 and 120 are transferred through these tail registers before the data can appear at a respective scan-output port SCAN_OUT#. The security-warning generator 140 is further configured to apply the SECURITY_WARNING signal to the security-reset generator 130.

In some embodiments, the IC 100 may have one or more additional instances (nominal copies) of the security-warning generator 140 similarly connected to the security-reset generator 130.

The security-reset generator 130 is configured to automatically generate the SECURITY_RESET signal in response to an asserted SECURITY_WARNING signal, appropriately conditioned on the other inputs indicated in FIG. 1. A more-detailed description of an example embodiment of the security-reset generator 130 is provided below in reference to FIG. 4.

When the SECURITY_RESET signal is asserted by the security-reset generator 130, the security-related scan chain 120 responds by automatically resetting (e.g., to zero) all information bits stored in its flip-flops. In addition, the input signal applied to the scan port SCAN_IN2 is routed to bypass the scan chain 120 and is instead connected, through the bypass switch 150, directly to the scan port SCAN_OUT2. Any data from the security-related scan chain 120 are therefore precluded, under these conditions, from being accessible through the scan ports SCAN_IN2 and SCAN_OUT2.

Figure 2:
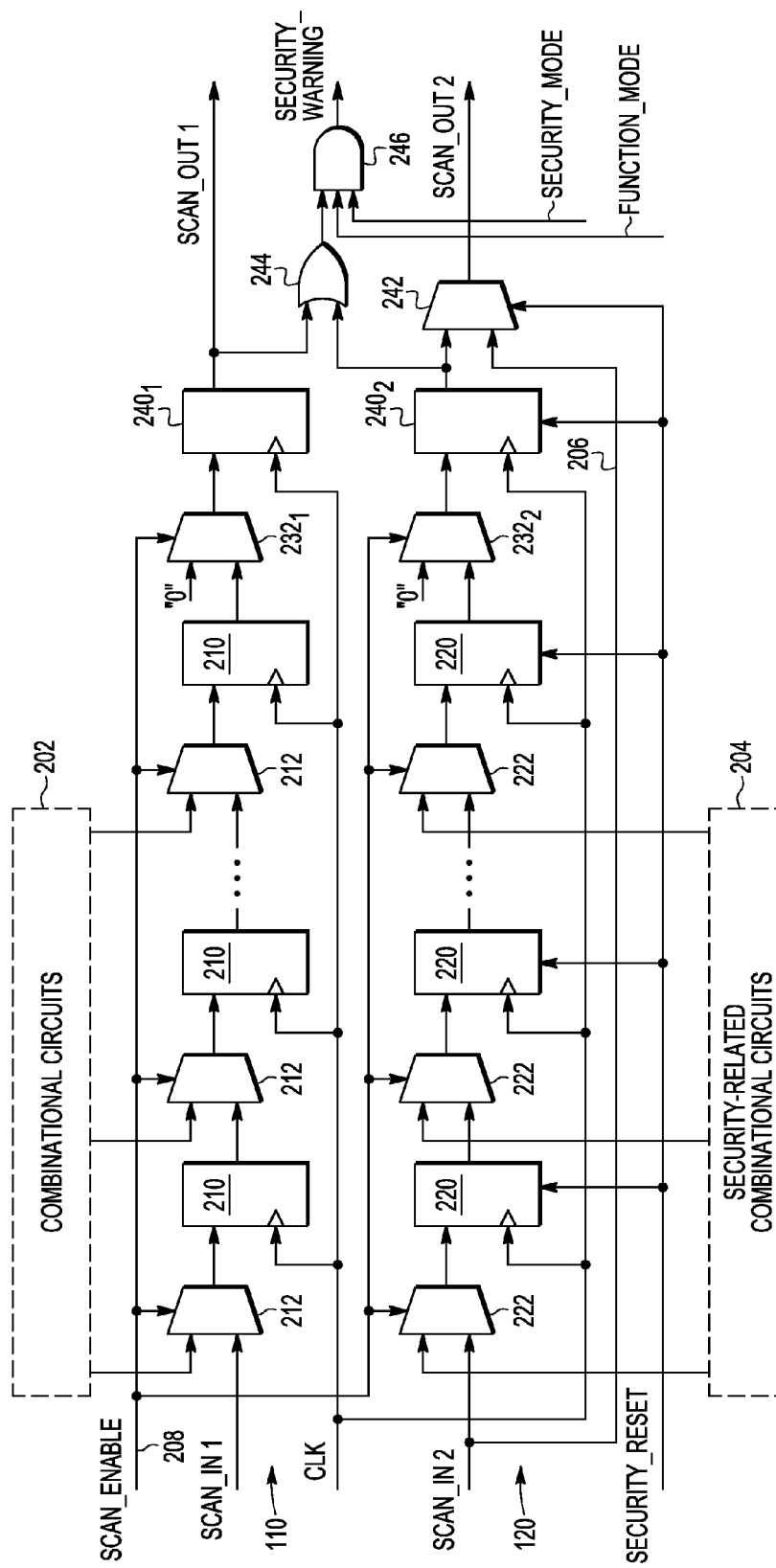
FIG. 2 is a schematic block diagram of circuitry of the IC of FIG. 1 according to an embodiment of the invention.

FIG. 2 is a block diagram of a circuit 200 that can be used in the IC 100 (FIG. 1) to implement the circuit elements 104, 106, 110, 120, 140, and 150 (see FIG. 1) according to an embodiment of the invention. More specifically, a scan-enable branch 208 implements the scan-enable branches 104 and 106 (FIG. 1). A plurality of flip-flops 210 and a plurality of muxes 212 implement an example embodiment of the scan chain 110. A plurality of flip-flops 220 and a plurality of muxes 222 implement an example embodiment of the scan chain 120. The muxes $232_1$ and $232_2$, the flip-flops $240_1$ and $240_2$, and an OR gate 244 implement an example embodiment of the security-warning generator 140. The MUX 242 is an example embodiment of the bypass switch 150.

When the SCAN_ENABLE signal is de-asserted at branch 208, the muxes 212 are in a state that causes the flip-flops 210 to be connected to the normal combinational circuits 202. Similarly, the muxes 222 are in a state that causes the flip-flops 220 to be connected to the security-related combinational circuits 204. As indicated above, in a function mode of the IC 100, the scan-chain flip-flops, such as the flip-flops 210 and 220, operate to support an intended function of the corresponding logic circuits, such as the normal combinational circuits 202 and the security-related combinational circuits 204.

When the SCAN_ENABLE signal is asserted at branch 208, the muxes 212 are in a state that causes the flip-flops 210 to be connected to one another in a linear shift register. Data can be shifted (i) into the flip-flops 210 from the input terminal SCAN_IN1 and (ii) out of the flip-flops 210 via the output terminal SCAN_OUT1, e.g., using the processing steps already mentioned above in reference to FIG. 1. Similarly, the muxes 222 are in a state that causes the flip-flops 220 to be connected to one another in another linear shift register. Data can be shifted (i) into the flip-flops 220 from the input terminal SCAN_IN2 and (ii) out of the flip-flops 220 via the output terminal SCAN_OUT2.

The flip-flop $240_1$ serves as a tail register of the scan chain 110 formed by the flip-flops 210, meaning that a data bit has to pass through the flip-flop $240_1$ before it can be shifted out of that scan chain and appear at the output terminal SCAN_OUT1. The flip-flop $240_2$ similarly serves as a tail register of the scan chain 120 formed by the flip-flops 220. As a result, data bits have to pass through the flip-flop $240_2$ before they can appear at the output terminal SCAN_OUT2.

Each of the muxes $232_1$ and $232_2$ has one of its inputs hard-connected to a logic zero, as indicated in FIG. 2. Herein, the term "hard-connected" means that the zero logic level of the corresponding input does not depend on the logic state of any of the control signals shown in FIG. 2. Hence, when the SCAN_ENABLE signal is de-asserted, each of the flip-flops $240_1$ and $240_2$ stores therein a logic zero written into it from the hard-connected input of the respective one of the muxes $232_1$ and $232_2$. The flip-flops $240_1$ and $240_2$ apply these logic zeros to the OR gate 244, thereby causing the OR gate 244 and the AND gate 246 to hold the SECURITY_WARNING signal at the de-asserted (zero) level. With the SECURITY_RESET signal being at the de-asserted level as well, the MUX 242 connects the output of the flip-flop $240_2$ to the terminal SCAN_OUT2, thereby causing that terminal to be at a logic level zero.

When the SCAN_ENABLE signal is asserted, the muxes $232_1$ and $232_2$ are automatically reconfigured to connect the inputs of the flip-flops $240_1$ and $240_2$ to the scan chains 110 and 120, respectively, instead of the respective hard-connected inputs. Thus, if the clock signal CLK is pulsed, then the logic zeros stored in the flip-flops $240_1$ and $240_2$ can be replaced by the logic values shifted in from the end flip-flops 210 and 220 of the scan chains 110 and 120, respectively. If at least one of those logic values happens to be a logic level one, then the output of the OR gate 244 will be at the logic level one. If the SECURITY_MODE and FUNCTION_MODE signals are asserted, then the AND gate 246 will cause the SECURITY_WARNING signal to be asserted. Note that, depending on the data stored in the scan chains 110 and 120, it might take more than one clock cycle of the clock signal CLK to cause the OR gate 244 and the AND gate 246 to assert the SECURITY_WARNING signal after the SCAN_ENABLE signal is asserted.

In an alternative embodiment, the muxes $232_1$ and $232_2$ may have their hard-connected inputs to be at the logic level one. From the above description, a person of ordinary skill in the art will understand how to configure and operate the corresponding embodiment of the circuit 200 in a manner consistent with the above-described intended function of that circuit.

When the SECURITY_WARNING signal is automatically asserted due to an unexpected access to or manipulation of the control-signal level at any branch of the scan-enable tree 112 (FIG. 1), the SECURITY_RESET signal could also be automatically asserted by the security-reset generator 130 (FIG. 1), e.g., as explained in more detail below in reference to FIGS. 4-7. When the SECURITY_RESET signal is asserted, the mux 242 switches into a state in which (i) the flip-flop $240_2$ and the scan chain 120 are disconnected from the output terminal SCAN_OUT2 and (ii) the output terminal SCAN_OUT2 is directly connected to the input terminal SCAN_IN2 via a corresponding bypass line 206 and the mux 242. In addition, any data stored in the flip-flops 220 are reset, e.g., by being all replaced by logic zeros.

FIG. 3 is a block diagram of a logic circuit 300 that can be used in the circuit 200 (FIG. 2) according to an alternative embodiment of the invention. More specifically, the logic circuit 300 includes the AND gates $302_1$ and $302_2$ configured to replace the elements $232_1$, $232_2$, $240_1$, and $240_2$ in the circuit 200 (FIG. 2).

In operation, the logic circuit 300 asserts the SECURITY_WARNING signal under the same conditions as the circuit 200 (FIG. 2). For example, when the SCAN_ENABLE signal is de-asserted, the outputs of the AND gates $302_1$ and $302_2$ are both at a logic level zero. As a result, the output of the OR gate 244 is also at a logic level zero, which means that the SECURITY_WARNING signal is de-asserted as well. When the SCAN_ENABLE signal is asserted and the input from the scan chain 110 happens to be at the logic level one, the output of the AND gate $302_1$ will be at the logic level one. Similarly, when the SCAN_ENABLE signal is asserted and the input from the scan chain 120 happens to be at the logic level one, the output of the AND gate $302_2$ will be at the logic level one. When at least one of the outputs of the AND gates $302_1$ and $302_2$ is at the logic level one, the output of the OR gate 244 will also be at the logic level one. If the SECURITY_MODE and FUNCTION_MODE signals are asserted, then the AND gate 246 will cause the SECURITY_WARNING signal to be asserted.

FIG. 4 is a block diagram of a logic circuit 400 that can be used in the IC 100 (FIG. 1) to implement the security-reset generator 130 (see FIG. 1) according to an embodiment of the invention. The logic circuit 400 receives the following input signals: RESET, SCAN_ENABLE, SCAN_MODE, SECURITY_MODE, FUNCTION_MODE, and SECURITY_WARNING, and generate the output signals SECURITY_RESET and SCAN_MODE_TO_SOC, whose logic levels depend on the logic levels of the input signals.

The logic circuit 400 includes a latch 412 configured to convert the local input signal SCAN_MODE into a system-wide control signal SCAN_MODE_TO_SOC. More specifically, when the input signal SCAN_MODE is asserted, e.g., from a corresponding input pin, the system-on-a-chip (SoC) as a whole does not enter the scan mode until the latch 412 asserts the system-wide control signal SCAN_MODE_TO_SOC. However, the configuration of the latch 412 is such that the system-wide control signal SCAN_MODE_TO_SOC is not asserted unless the SECURITY_RESET signal becomes asserted. As already indicated above, assertion of the SECURITY_RESET signal causes a reset of all security-related data stored in security-related scan chains of the corresponding IC, such as the scan chain 120 (FIG. 1).

The logic circuit 400 further includes the AND gates 402 and 404 and the OR gates 408 and 410. In operation, the AND gates 402 and 404 and the OR gates 408 and 410 process the input signals RESET, SCAN_ENABLE, SECURITY_MODE, FUNCTION_MODE, and SECURITY_WARNING to generate the SECURITY_RESET signal. Several representative examples of the responses of the logic circuit 400 to changes in the logic levels of its input signals are described in more detail below in reference to FIGS. 5-7.

Figure 5:
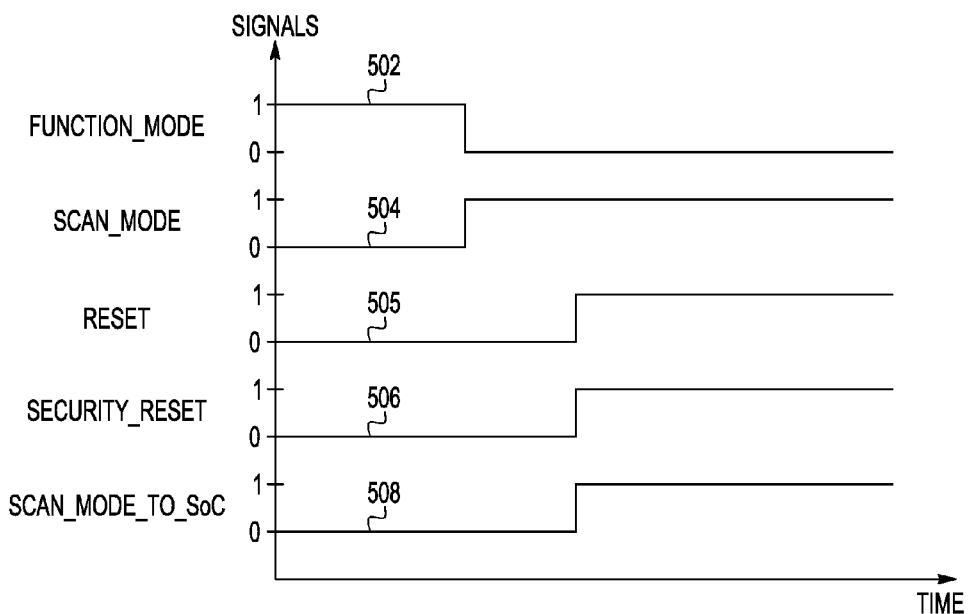
FIGS. 5-7 are timing diagrams that graphically illustrate various signals that may be generated in the IC of FIG. 1 according to an embodiment of the invention.
Figure 6:
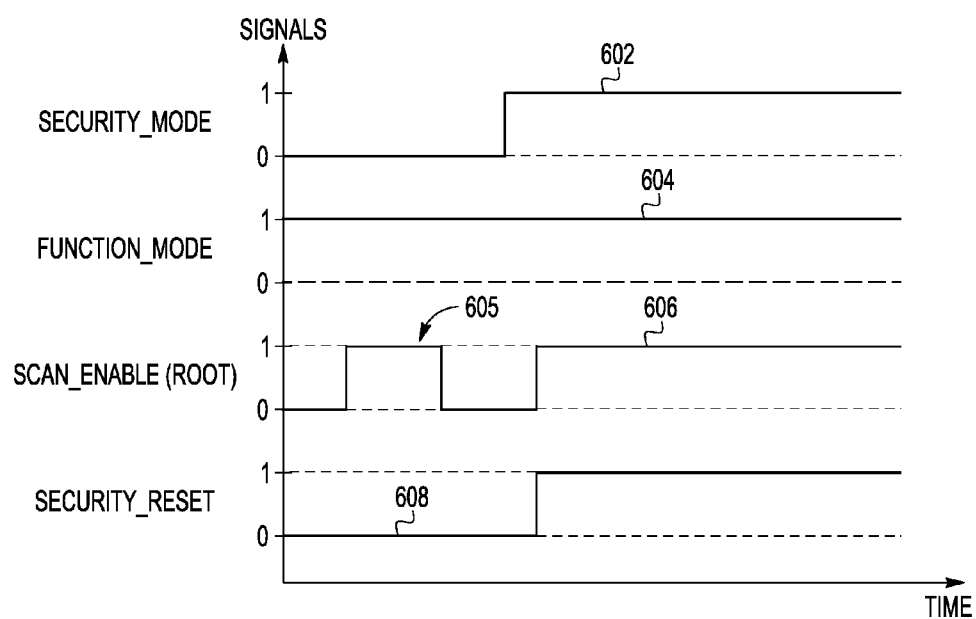
Figure 7:
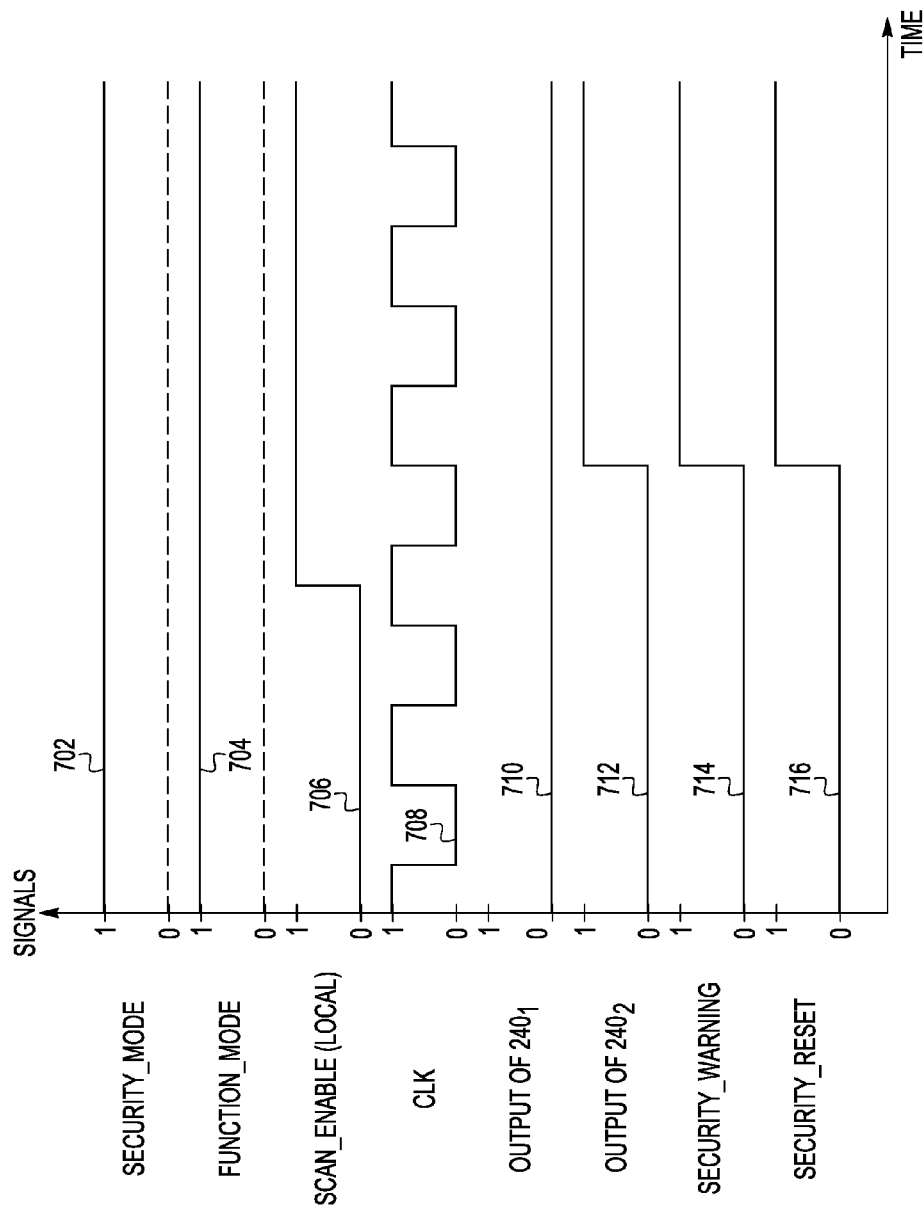

FIGS. 5-7 are timing diagrams that graphically illustrate various signals that can be generated in the IC 100 (FIG. 1) according to an embodiment of the invention. Where appropriate, the description of FIGS. 5-7 provided below may also refer to FIGS. 1-4.

FIG. 5 graphically illustrates a situation in which an IC user attempts to access security-related data by switching from a function mode to a scan mode. In this situation, the IC user de-asserts the FUNCTION_MODE signal, as indicated in FIG. 5 by a waveform 502. At the same time, the IC user asserts the SCAN_MODE and RESET signals, as indicated in FIG. 5 by the waveforms 504 and 505, respectively. In response to the RESET signal being asserted, the IC 100 asserts the SECURITY_RESET signal, as indicated in FIG. 5 by a waveform 506. The latch 412 then responds to the assertion of the SECURITY_RESET signal by asserting the control signal SCAN_MODE_TO_SOC, as indicated in FIG. 5 by a waveform 508. After the SCAN_MODE_TO_SOC signal is asserted, the user may get access to the contents of the scan chains. However, the user still cannot shift out any security-related data because the assertion of the SECURITY_RESET signal has already caused a reset of all security-related data in the security-related scan chains of the IC.

FIG. 6 graphically illustrates situations in which an IC user attempts to access security-related data by asserting the SCAN_ENABLE signal from a root location (such as the pad or a pin 102, FIG. 1) when the IC is in a non-secure function mode and when the IC is in a secure function mode. The transition from a non-secure function mode to a secure function mode occurs when the SECURITY_MODE signal is asserted as indicated in FIG. 6 by the waveforms 602. Before the transition, i.e., when the SECURITY_MODE signal is de-asserted, assertion of the SCAN_ENABLE signal, e.g., as indicated in FIG. 6 by the pulse 605, does not cause a security reset. In contrast, after the transition, i.e., when the SECURITY_MODE signal and the FUNCTION_MODE signal are both in the asserted state, as indicated in FIG. 6 by the waveforms 602 and 604, a security reset occurs when the IC user asserts the SCAN_ENABLE signal, e.g., as indicated in FIG. 6 by a waveform 606. In this situation, the logic gates 402, 404, 408, and 410 (see FIG. 4) cause the SECURITY_RESET signal to become asserted as well, as indicated in FIG. 6 by a waveform 608. As a result, the user will not be able to shift out any security-related data because the assertion of the SECURITY_RESET signal causes a reset of all security-related data in the security-related scan chains of the IC. Note that, in this situation, no assertion of the SECURITY_WARNING signal must occur for a security reset to go into effect.

FIG. 7 graphically illustrates a situation in which an IC user attempts to access security-related data by asserting the SCAN_ENABLE signal from any branch of the scan-enable tree other than the root location when the IC is in a secure function mode. The used location can be, for example, a local scan-enable branch that controls a particular subset of scan chains, such as the scan-enable branch 208 shown in FIG. 2. In this situation, the control signal SCAN_ENABLE applied to the security-reset generator 130 (FIG. 1) or 400 (FIG. 4) might still remain de-asserted.

As in the case illustrated by FIG. 6, the SECURITY_MODE signal and the FUNCTION_MODE signal are both in the asserted state, as indicated in FIG. 7 by the waveforms 702 and 704. When the SCAN_ENABLE signal is asserted at the branch 208 (FIG. 2), e.g., as indicated in FIG. 7 by a waveform 706, the shift out of the scan chains 110 and 120 (FIG. 2) may begin at the rising edge of the next clock cycle of the clock signal CLK shown in FIG. 7 by a waveform 708. The shifted bits are first captured by the tail registers $240_1$ and $240_2$ (see FIG. 2). If at least one of the shifted bits happens to be a logic one, e.g., as indicated in FIG. 7 by the waveforms 710 and 712, then the OR gate 244 (FIG. 2) responds by asserting the SECURITY_WARNING signal, as indicated in FIG. 7 by a waveform 714. When the SECURITY_WARNING signal is asserted, the security-reset generator 130 (FIG. 1) or 400 (FIG. 4) responds by asserting the SECURITY_RESET signal, as indicated in FIG. 7 by a waveform 716. As a result, the user will not be able to shift out any security-related data because the assertion of the SECURITY_RESET signal causes a reset of the security-related data in the security-related scan chains of the IC.

In some embodiments, inventive concepts disclosed herein may be used in an IC in which the registers are connectable to form a single scan chain. An example embodiment of such an IC comprises a plurality of registers configured to be connected in one or more scan chains for scan-testing the IC in response to a scan-enable signal being asserted; and a security-warning generator connected to the scan chains and configured to assert a security-warning signal in response to the scan-enable signal being asserted at a first subset of the scan chains, where the IC is automatically configurable to prevent data from being read from at least some of the registers in response to the security-warning signal being asserted by the security-warning generator.

Although the present invention has been described in the context of scan chains implemented using flip-flops, those skilled in the art will understand that other types of registers, such as (without limitation) latches, may be used.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. An integrated circuit, comprising:
   a plurality of registers connected in two or more scan chains for scan-testing the integrated circuit, wherein said scan-testing is performed when in a scan-enable signal is asserted;
   a security-warning generator, connected to the second scan chain of the two or more scan chains, that asserts a security-warning signal in response to the scan-enable signal being asserted at the second scan chain, wherein the security-warning generator prevents data from being read from at least a first predetermined number of the registers of the second scan chain in response to the security-warning signal being asserted by the security-warning generator; and
   a security-reset generator, connected to the security-warning generator, that asserts a security-reset signal in response to the security-warning signal being asserted by the security-warning generator, wherein the data in the first predetermined number of registers of the second scan chain is reset in response to the security-reset signal being asserted.

2. The integrated circuit of claim 1, wherein the at least some of the registers of the second scan chain are used to store security-related data.

3. The integrated circuit of claim 1, further comprising a bypass switch connected between an input terminal and an output terminal of the second scan chain, wherein the bypass switch is configurable to connect the input terminal and the output terminal to one another to bypass the second scan chain when the security-warning signal is asserted.

4. The integrated circuit of claim 1, further comprising a scan-enable tree having a plurality of branches, each branch configured to apply the scan-enable signal to a respective one of the two or more scan chains, wherein the security-warning generator asserts the security-warning signal when the scan-enable signal is being asserted at at least one of the branches when the scan-enable signal is not asserted at at least another one of the branches.

5. The integrated circuit of claim 4, wherein:
   the scan-enable tree comprises a trunk electrically connected to the plurality of branches and to a peripheral pin of the integrated circuit; and
   the security-warning generator asserts the security-warning signal when the scan-enable signal is asserted at the trunk of the scan-enable tree or at the peripheral pin of the integrated circuit.

6. The integrated circuit of claim 1, wherein the security-warning signal is asserted in response to the scan-enable signal when the integrated circuit is in a secure functional mode.

7. The integrated circuit of claim 1, further comprising a bypass switch that is configurable to preclude the data from being shifted out of the second scan chain to an output terminal of the integrated circuit when the security-warning signal is asserted by the security-warning generator.

8. The integrated circuit of claim 1, wherein the security-warning generator comprises:
a first register connectable to an end of the first scan chain in response to the scan-enable signal being asserted;
a first multiplexer coupled between a last register of the first scan chain and the first register and controlled by the scan-enable signal, wherein a first input of the first multiplexer is connected to a first fixed logic level, and a second input of the first multiplexer is connected to the last register of the first scan chain; and
logic circuitry that generates the security-warning signal in response to an output signal generated by the first register.

9. The integrated circuit of claim 8, wherein the security-warning generator further comprises:
a second register connectable to an end of the second scan chain in response to the scan-enable signal being asserted; and
a second multiplexer coupled between the last register of the second scan chain and the second register and controlled by the scan-enable signal, wherein a first input of the second multiplexer is connected to the first fixed logic level, and a second input of the second multiplexer is connected to the last register of the second scan chain, and
wherein the logic circuitry generates the security-warning signal in response to an output signal generated by the second register.

10. The integrated circuit of claim 1, wherein the security-warning generator asserts the security-warning signal in response to the scan-enable signal being asserted at the first second scan chain when the scan-enable signal is not asserted at the first scan chain.

11. The integrated circuit of claim 1, wherein the security-warning generator comprises a plurality of logic gates coupled to an output of a first of the two or more scan chains, and to an output of a second of the two or more scan chains, wherein the security-warning generator receives the scan-enable signal, a security-mode signal, and a function-mode signal.

12. The integrated circuit of claim 1, wherein the security-reset signal is different from the security-warning signal.

13. The integrated circuit of claim 1, wherein the security-reset generator receives the scan-enable signal and generates the security-reset signal based on the scan-enable signal.

14. The integrated circuit of claim 13, wherein the security-reset generator receives at least one other control signal in addition to the scan-enable signal and the security-warning signal, and generates the security-reset signal based on the at least one other control signal.

15. The integrated circuit of claim 1, wherein the security-reset generator asserts the security-reset signal when the security-warning signal is asserted, regardless of a logic state of the scan-enable signal.

16. The integrated circuit of claim 1, wherein the security-reset generator comprises at least one AND gate and at least one OR gate.

* * * * *